United States Patent [19]

Sakuma

[11] 4,384,287
[45] May 17, 1983

[54] INVERTER CIRCUITS USING INSULATED GATE FIELD EFFECT TRANSISTORS

[75] Inventor: Hiraku Sakuma, Tokyo, Japan
[73] Assignee: Nippon Electric Co., Ltd., Tokyo, Japan
[21] Appl. No.: 139,267
[22] Filed: Apr. 11, 1980
[30] Foreign Application Priority Data Apr. 11, 1979 [JP] Japan .................................. 54-44014

[51] Int. Cl.³ ...................... G09G 3/28; H03K 19/094
[52] U.S. Cl. .................................... 340/771; 307/270; 307/443; 307/446; 307/451; 315/169.4
[58] Field of Search .................... 307/317 A, 443, 445, 307/448, 482, 578, 270, 451, 585, 446; 315/169.4; 340/771

[56] References Cited

U.S. PATENT DOCUMENTS

| 3,025,411 | 3/1962 | Rumble | 307/270 |
| 3,480,796 | 11/1969 | Polkinghorn et al. | 307/578 |
| 3,712,995 | 1/1973 | Steudel | 307/200 B X |
| 3,806,773 | 4/1974 | Watanabe | 307/200 B X |
| 3,823,330 | 7/1974 | Rapp | 307/475 |
| 3,896,430 | 7/1975 | Hatsukano | 307/270 X |
| 3,987,337 | 10/1976 | Nishida et al. | 315/169.4 |
| 4,064,405 | 12/1977 | Cricchi et al. | 307/451 |
| 4,070,600 | 1/1978 | Butler et al. | 340/771 |
| 4,253,035 | 2/1981 | Amitay | 307/270 |
| 4,284,905 | 8/1981 | Rosenzweig | 307/482 |
| 4,311,922 | 1/1982 | Puckette | 307/270 |

OTHER PUBLICATIONS

H. Hada and T. Hirayama, "Improved Plasma Display Unit" NEC Research & Development–No. 46, Jul. 1977; pp. 18–23.

Primary Examiner—Larry N. Anagnos
Attorney, Agent, or Firm—Laff, Whitesel, Conte & Saret

[57] ABSTRACT

An inverter circuit comprises a pair of N- and P-channel insulated gate field effect transistors coupled in series. One of the transistors is used as a load transistor and the other is used as a drive transistor. A diode is connected between the source and gate electrodes of the load transistor in order to hold the gate voltage of the load transistor. A resistor and a capacitor (having a larger capcitance than the gate capacitance of the load transistor) is connected to the gate electrode of the load transistor. In operation, a high voltage is applied to the source electrode of the load transistor. A low-voltage pulse, having a period shorter than the RC time constant of the resistor and capacitor, is applied through the capacitor to the gate electrode of the load transistor. The gate electrode of the drive transistor is supplied with a low-voltage input signal (having a phase which is the same as and not longer than the period of the pulse applied to the capacitor). An input pulse signal may be used as the low-voltage pulse which is applied to the capacitor.

18 Claims, 21 Drawing Figures

INVERTER CIRCUITS USING INSULATED GATE FIELD EFFECT TRANSISTORS

BACKGROUND OF THE INVENTION

1. Field of the Invention

The present invention relates to an inverter circuit using insulated gate field effect transistors and more particularly to a high voltage inverter circuit for generating a high voltage pulse train in response to a low voltage input, at the voltage level of electronic circuits using insulated gate field effect transistors. Hereinafter, insulated gate field effect transistors are referred to as MOS (Metal-Oxide-Semiconductor) transistors which are representative of the insulated gate field effect transistors.

An example of use for such a high voltage inverter circuit is a generator of high-voltage and high-frequency pulses for driving an alternating current (AC) drive type plasma display panels, an electrostatic printing devices, or the like. An inverter circuit using the MOS transistors will be briefly referred hereinafter to as a MOS inverter.

2. Description of the Prior Art

A discharge cell of an AC plasma display panel requires a relatively high initial firing voltage. For instance, high pulse voltages of 250 to 300 volts must be applied to a gas discharge cell. Especially, for the AC drive type of plasma display panel to be driven in a scanning mode, the drivable electrode number and brightness are determined by the frequency of the applied drive pulses. In such an operation, therefore, a pulse generating circuit or inverter circuit to generate a high voltage and high speed pulse train is indispensable.

Since it has conventionally been difficult to obtain anything other than a bipolar transistor which may be used as a high voltage transistor, bipolar transistors have been used in almost every circuit for driving an AC type plasma display panel. However, the high voltage bipolar transistor has many drawbacks such that an operating speed is restricted due to the minority carrier storage effect, and a second breakdown is liable to occur. Assuming that such bipolar transistors are used for an inverter circuit to generate a high-voltage, high-frequency pulse train having a frequency higher than 500 KHz at a voltage of 250 to 300 volts, it is difficult to mass produce it in a satisfactory yield and at a low cost. Recently, various efforts have been made to increase the drain breakdown voltage of the MOS transistor. High voltage MOS transistors have been obtained which can stand a voltage higher than 200 to 300 volts in either the N-channel or the P-channel. Such high voltage MOS transistors are disclosed in U.S. Pat. No. 4,172,260 issued to Takeaki Okabe et al. on Oct. 23, 1979. The MOS transistor is found to be promising as a high voltage circuit element because it has a high operating speed and a high voltage circuit element because it has a high operating speed and a high breakdown voltage due to its negative temperature characteristics with respect to current. Thus, it is desirable to use a MOS inverter for high voltage and high frequency applications, in place of the conventional inverter circuit employing bipolar elements.

SUMMARY OF THE INVENTION

It is, therefore, an object of the present invention to provide a high voltage MOS inverter with a low power consumption and a high speed operation.

Another object of the present invention is to provide a high voltage pulse generating circuit using a high voltage MOS inverter in a configuration which is suited for driving plasma display at a high speed.

According to the present invention, an inverter circuit comprises a pair of N-and-P channel insulated gate field effect transistors coupled in series. One of the transistors is used as a load transistor and the other is used as a drive transistor. A diode is connected between the source and gate electrodes of the load transistor in order to hold the gate voltage of the load transistor. A resistor and a capacitor, having a larger capacitance than the gate capacitance of the load transistor, is connected to the gate electrode of the load transistor. In operation, a high voltage is applied to the source electrode of the load transistor. A low voltage pulse having a period shorter than the RC time constant, as determined by the resistor and capacitor connected to the gate of the load transistor, is applied through the capacitor to the gate electrode of the load transistor. The gate electrode of the drive transistor is supplied with a low voltage input signal, having the same phase as and a duration which is no longer than the period of the low voltage pulse applied to the capacitor. The input pulse signal may be used as the low voltage pulse applied to the capacitor.

BRIEF DESCRIPTION OF THE DRAWINGS

FIG. 1 shows a MOS inverter, according to the prior art, in which a resistor 5 is used as a load and a high voltage MOS transistor 4 is used as a driver. In this inverter circuit, the high voltage pulse output having a power potential $V_0$ is applied to a power supply terminal 1 and obtained from an output terminal 3 by applying a low voltage input signal $V_{in}$ to an input terminal 2. If, however, the value of the resistor 5 is increased in order to suppress the driving power consumption of the MOS inverter, due to the high voltage operation, the switching speed of the MOS inverter is decreased. Thus, it becomes practically impossible to achieve the high speed operation which is needed for driving the plasma display panel or the like.

Figure 1:
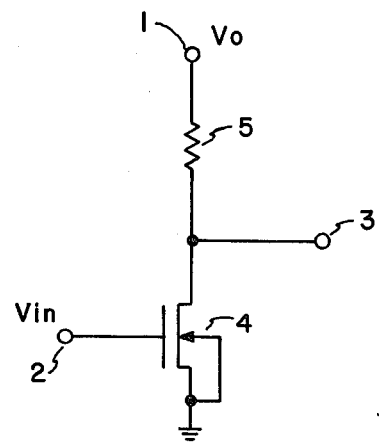
FIG. 1 is a circuit diagram showing a resistor load type of inverter circuit, according to the prior art.
Figure 2:
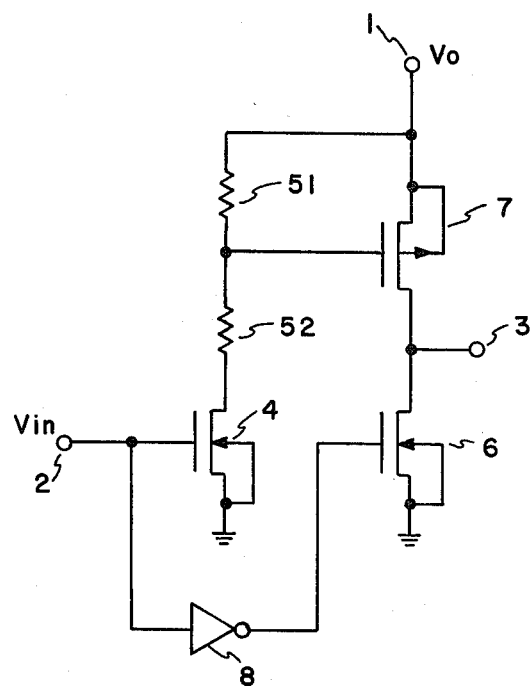
FIG. 2 is a circuit diagram showing a high voltage complementary MOS (CMOS) inverter accompanied by a resistor load type gate drive inverter circuit, according to the prior art.

In order to increase the speed of the MOS inverter, while suppressing the power consumption, it is effective to use an active load as shown in FIG. 2. The complementary MOS (CMOS) structure has an N-channel MOS transistor and a P-channel MOS transistor. Generally speaking, in a low voltage inverter circuit having the CMOS structure, a common input signal, having the whole logic amplitude, is applied to both gate of a load transistor 7 and to a driver transistor 6. In the high voltage complementary MOS inverter (hereinafter, called the "CMOS inverter"), however, the input voltage corresponding to the logic amplitude reaches as high as 200 to 300 volts. First a problem arises in the gate breakdown voltage (which is about 50 volts at the highest for a gate oxide film having a thickness of 1000 A). Secondly, it is quite difficult to generate gate signals of such a large amplitude.

The MOS inverter shown in FIG. 2 solves the aforementioned difficulties by dividing the load resistors 51 and 52, with a suitable ratio, in the preceding stage inverter circuit of the high voltage CMOS inverter. More specifically, a voltage having a suitable level is used as the gate input signal of the load transistor 7 of the CMOS inverter circuit. This input signal is produced across the resistor 51 by turning on and off the driver transistor 4 of the preceding stage, inverter circuit responsive to the input signal $V_{in}$ fed from the input terminal 2. Incidentally, the driver transistor 6 of the CMOS inverter circuit has its gate connected to the input terminal 2 via another inverter circuit 8, to receive an inverted form of the input signal.

Although the above mentioned MOS inverter achieves a high output operation, owing to an active load of a transistor in the output stage CMOS inverter circuit, the switching speed and power consumption are restricted by the preceding stage inverter with a resistor load. Therefore, a remarkable improvement in the characteristics cannot be expected.

DESCRIPTION OF THE PREFERRED EMBODIMENTS

One embodiment of the present invention will now be described with reference to FIG. 3. A load transistor 7, of a P-channel high voltage MOS transistor type, has its source electrode connected to a power supply terminal 1 and its drain electrode connected to an output terminal 3. A shunt resistor 53 and a diode 9 are connected in parallel between the gate and source of the load transistor 7. The polarity of the diode 9 is directed to provide a clamping of the gate voltage. The gate electrode of the load transistor 7 is connected through a capacitor 10 to an input terminal 2. A driver transistor 6, of an N-channel high voltage MOS transistor type, is complementarily connected with the load transistor 7. Drain and gate electrodes of the driver transistor 6 are connected to the output terminal 3 and the input terminal 2, respectively, and its source electrode is grounded.

A high voltage $V_0$ is applied to the power supply terminal 1 and a low voltage input signal $V_{in}$ to the input terminal 2.

Figure 4A:
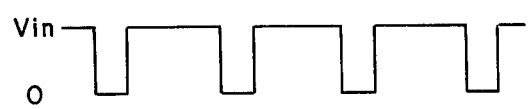
FIGS. 4A to 4C show voltage waveforms illustrating the operations of the first embodiment of FIG. 3.

In the present embodiment, the input pulse signal $V_{in}$ has an amplitude of 5 volts as a typical example, and the supply voltage $V_0$ is higher than 200 to 300 volts. As shown in FIG. 4A, when the voltage of the input signal is at a high level $V_{in}$, the driver transistor 6 is turned on. The load transistor 7 is off because its gate potential is made equal to the power supply potential $V_0$, through the shunt resistor 53. As a result, a zero volt is generated at the output terminal 3, and the voltage of $(V_0-V_{in})$ is applied across the capacitor 10.

Figure 4B:
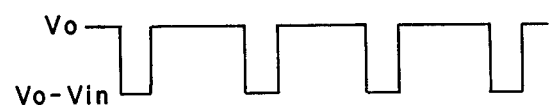

When the input voltage is changed to zero, the driver transistor 6 is turned off. On the other hand, the structure of the gate electrode-gate insulator-channel region of the MOS transistor 7 can be deemed to be a kind of capacitor. Thus, the capacitor 10 and the MOS gate capacitance of the load transistor 7 are connected in series when the supply voltage $V_0$ is viewed from the input terminal 2. The capacitance of the capacitor 10 is sufficiently larger than the capacitance of the MOS gate capacitor. When the input signal is switched to a low level or to zero volts, the load transistor 7 is turned on, and the supply voltage $V_0$ appears at the output terminal 3. This is because a potential difference substantially equal to the amplitude of the input voltage $V_{in}$ appears between the source and the gate of the load transistor 7, as shown in FIG. 4B.

Figure 4C:
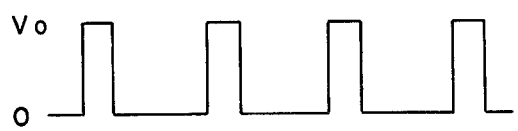

In this manner, an output pulse train of high voltage $V_0$ can be obtained from the output terminal 3, with a phase which is opposite to the phase of the input pulse signal, as shown in FIG. 4C, thus performing the inverter operation. The resistivity of the shunt resistor 53 is such that the RC time constant, with the capacitor 10, is high enough with respect to the width of a pulse width which turns on the load transistor 7. Also, the resistivity of the shunt resistor 53 is such that the gate is shunted to prevent an undesirable gate voltage which may be otherwise generated responsive to noise signals. The diode 9 has a function of deriving the pulse signals generated in the gate circuit of the load transistor 7, as a gate drive signals of the load transistor 7, i.e., diode 9 provides a function of clamping the mentioned pulse signals at the high voltage potential $V_0$.

Figure 3:
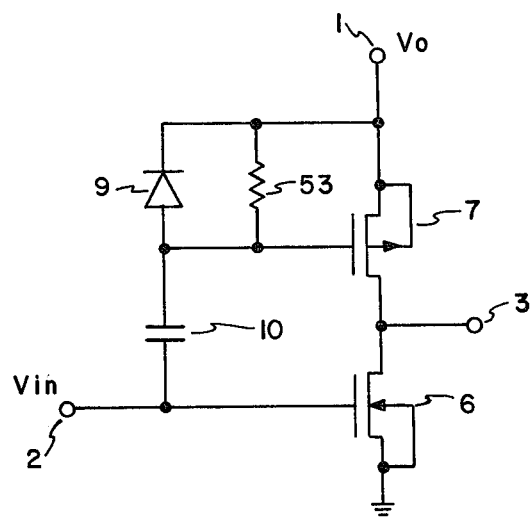
FIG. 3 is a circuit diagram showing a high voltage CMOS inverter according to a first embodiment of the present invention.

The inverter circuit shown in FIG. 3 can be employed as a high voltage pulse generator for a plasma display device. In such an application, a drain breakdown voltage and an on-resistance of the transistors 6 and 7 are typically 300 volts and 10 ohms, respectively. Wherein, the load transistor 7 has a gate input capacity of 300 pF. If the capacitance of the capacitor 10 is 3000 pF, the resistance of the resistor 53 is 10 Kohms, the power supply voltage $V_0$ is 250 volts, and the gate input voltage is 5 volts, respectively, the drive of a plasma discharge cell having a discharge area of 750 mm² can be operated at a clock frequency of 1 MHz, i.e., with a pulse width of 500 ns under the unidirectional-type drive method.

The inverter circuit shown in FIG. 3 has various modifications. For instance, a Zener diode can be used in place of the clamping diode 9, to prevent the gate oxide film of the load transistor 7 from being broken by an excessive gate input voltage. More specifically, the Zener diode controls the voltage level so that the polarity of the input pulses applied to the gate electrode of the load transistor 7 is in the turn-on-direction and plays a role for protecting the gate. Such an excessive voltage takes place, for example, when the supply voltage is abruptly applied to the inverter circuit and most of the power voltage $V_0$ is produced at the gate electrode, at the capacitance ratio between the coupling capacitor 10 and the MOS gate capacitor of the load transistor 7.

Figure 5:
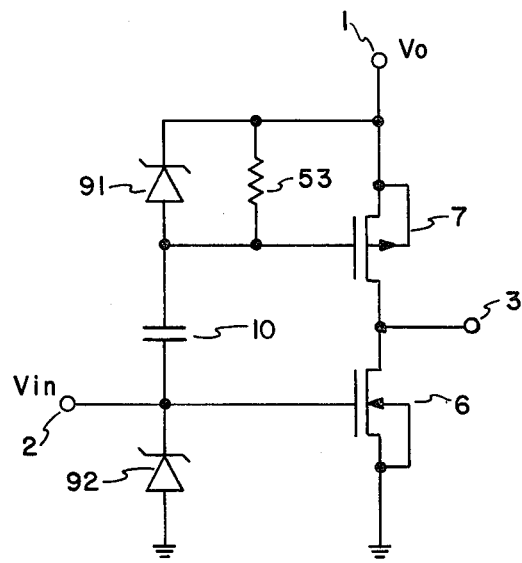
FIG. 5 is a circuit diagram showing one modification of the inverter circuit shown in FIG. 3.

In FIG. 5, a preferred embodiment has a Zener diode 92 connected between the gate electrode of the driver transistor 6 and ground, for protecting the oxide film of the gate in addition to a clamping Zener diode 91. FIG. 5 uses the same reference numerals as those used in FIG. 3 to identify similar elements.

As the driving method for the plasma display panel, a balance-type drive method can be used in addition to the aforementioned unidirectional-type drive method.

Figure 6:
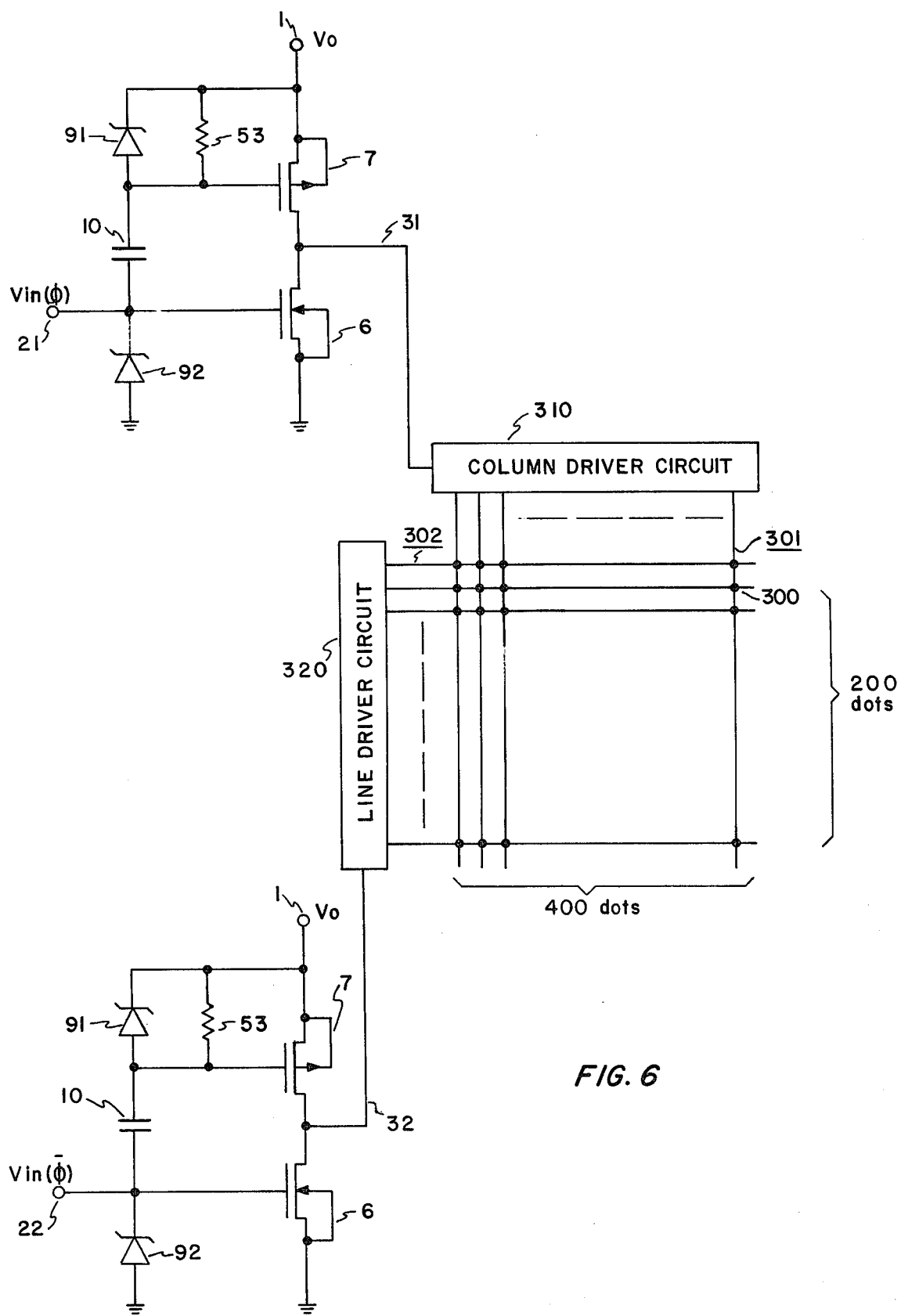
FIG. 6 is a diagrammatical circuit diagram showing one embodiment, in which two inverter circuits shown in FIG. 5 are used to drive the plasma display panel of an X-Y dot matrix type.

The balance-type drive method will now be described with reference to FIG. 6. FIG. 6 shows an X-Y matrix type plasma display panel of 400 dots×200 dots. A pair of the inverter circuits shown in FIG. 5 are employed as the high voltage pulse generator for a column driver circuit 310 and a line driver circuit 320. Each dot or discharge cell, as formed at intersection 300 of the column electrodes 301 and the line electrodes 302, for example, is sized at 0.5 mm×0.5 mm. The supply voltage $V_0$ is set at 150 volts. The other circuit elements are designed in a manner similar to the elements of the aforementioned unidirectional-type drive circuits.

Figure 7A:
FIGS. 7A to 7E show voltage waveforms illustrating the balance-type drive method of FIG. 6.
Figure 7B:
Figure 7C:
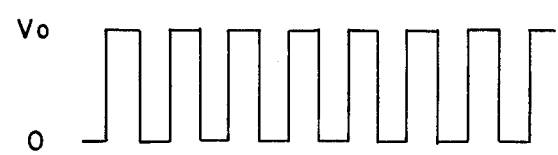
Figure 7D:
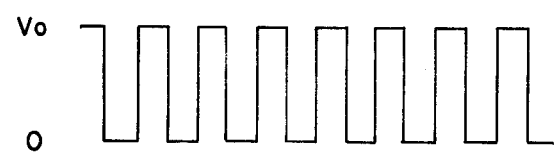
Figure 7E:
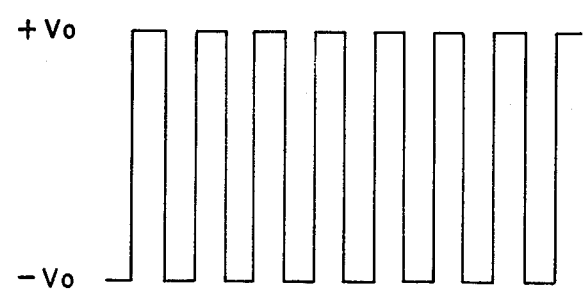

As input signals, pulse trains having a high level voltage of 5 volts and a clock frequency of 2 MHz in the opposite phases $\phi$ and $\bar{\phi}$ (FIGS. 7A and 7B) are applied to input terminals 21 and 22, respectively. Then, high voltage output pulses having pulse widths of 250 ns, with a voltage of 150 volts and a clock frequency of 2 MHz appear in opposite phases at the output terminals 31 and 33, as shown in FIGS. 7C and 7D. Thus, the selected dot is supplied with high frequency pulses of a cumulative 300 volts, as shown in FIG. 7E. As for the column driver circuit 310 and the line driver circuit 320, a detailed explanation is omitted since one example of such a driver circuit is disclosed in the Paper of H. Hada, et al. titled "Improved Plasma Display Unit", pages 13 to 23 of "NEC Research & Development No. 46, July 1977", especially, in FIG. 5 on page 22 thereof.

Next to be described is the differences in the operational effects of the conventional circuit shown in FIG. 2 and the present invention shown in FIG. 3. These differences will be described in detail by taking the example of generating a pulse train of about 250 volts and one MHz.

In FIG. 2, it is assumed that the MOS drain capacitance $C_D$ of the transistor 4 has a value of 10 pF and that the MOS gate capacitance $C_G$ of the load transistor 7 has a value of 300 pF. For this assumption, the sum $(R_1+R_2)$ of the resistance $R_1$ of the resistor 51 and the resistance $R_2$ of the resistor 52 has a value of about 5 Kohms. Therefore, the charge and discharge time constants of the drain capacitance $C_D$ and the gate capacitance $C_G$ are expressed by the following Equations, respectively:

$$C_D \cdot (R_1+R_2)=10^{-11}\times 5\times 10^3=5\times 10^{-8},$$

and $$C_G \cdot R_1=3\times 10^{-10}\times 1\times 10^2=3\times 10^{-8}.$$

Here, the values of resistors $R_1$ and $R_2$ are such that the load transistor 7 is supplied with the gate input of about 5 volts, that is, the relationship of $R_1/R_2$ is 100 ohms/4.9 kilohms.

With the time constants of such an order, the pulse train of 250 volts and 500 ns ($=5\times 10^{-7}$ seconds) in pulse width can be generated from the output terminal 3.

In this instance, however, with the assumption of the duty cycle of the pulses of 50%, the power P required for the resistive load inverter at the front stage has a value of 6.25 watts, as found by the following Equation:

$$P=\tfrac{1}{2}\times V^2_0/(R_1+R_2)=\tfrac{1}{2}\times 250^2/5\times 10^3=6.25 \text{ watts.}$$

In the inverter circuit shown in FIG. 3, on the other hand, if the gate input capacity of the load transistor 7 is assumed to have a value of 300 pF, it is sufficient that the capacitance C of the gate coupling capacitor 10 has a value of 3000 pF, at most.

In this case, a driving power $P_D$ takes a value as low as 75 m watts, as set forth in the following Equation, because it is the power required for charging and discharging the gate coupled capacitor 10 of 3000 pF, with 5 volts and 1 MHz:

$$P_D=CV^2_{in}f=3\times 10^{-9}\times 5^2\times 10^6=75 \text{ milliwatts}$$

In other words, when the intention is to generate high speed and high voltage pulses of 250 volts and 1 MHz, the inverter circuit according to the present invention requires a power as high as 75 m watts. This circuit can easily generate even higher speed pulses of 2 MHz, without any difficulty, with the drive power of 150 m watts.

On the contrary, however, the conventional circuit shown in FIG. 2 requires the high voltage transistor 4 in the resistor-load inverter circuit and consumes a power of as high as 6.25 watts. When a higher speed pulse output is required, the summed resistance $(R_1+R_2)$ of the resistors 51 and 52 has to be reduced further. Thus, the driving power consumption becomes higher. If, on the other hand, the driving power is to be reduced to a level of 75 m watts as in the present invention, the summed resistance $(R_1+R_2)$ has to take a value of about 4.2 megohms. Then, the operating frequency of the inverter circuit takes a low value of several KHz. Even if a high voltage is required, the driving power consumption is constant, in principle, in the inverter circuit according to the present invention. In the conventional resistor-load inverter circuit shown in FIG. 2, however, there is a defect since the power consumption is abruptly increased in proportion to the square of the supply voltage.

Figure 8:
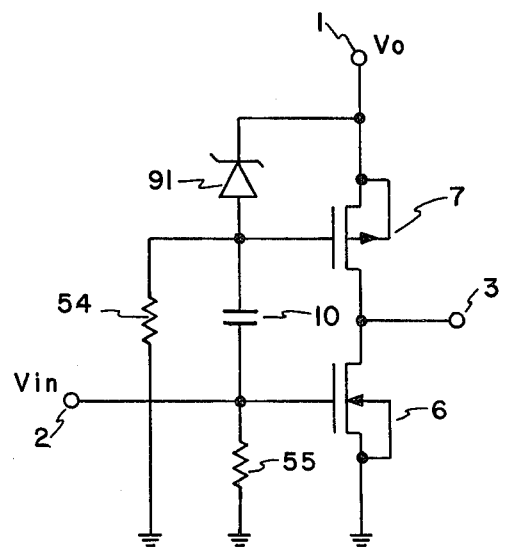
FIG. 8 is a circuit diagram showing another modification of the inverter circuit shown in FIG. 3.

The inverter circuit based upon the technical concept of the present invention should not be limited to the foregoing embodiments. In FIG. 8, for instance, the Zener diode 91 is connected between the gate and source electrodes of the load transistor 7, for clamping and gate protecting purposes. A resistor 54, having a high resistance, for preventing undesirable gate charging is also connected between the gate electrode of the load transistor 7 and ground. If needed, a resistor 55 may be connected between the gate electrode of the driver transistor 6 and the ground for the same purposes. The circuit, thus constructed, is operated so that the gate input voltage of the load transistor 7 has a value which is higher than the value, which is determined by subtracting the threshold voltage ($V_{thL}$) of the load transistor 7 from the reverse breakdown voltage ($V_Z$) of the Zener diode 91. The gate input voltage is set by adjusting the voltage of an input signal which is applied to the input terminal 2. If, in this instance, the input signal is zero volts, the driver transistor 6 is turned off whereas the load transistor 7 is always kept on.

If, a voltage higher than ($V_Z-V_{thL}$) appears at the gate of the load transistor 7, it is completely turned off when the input signal has such a high level which turns on the driver transistor 6.

Figure 9:
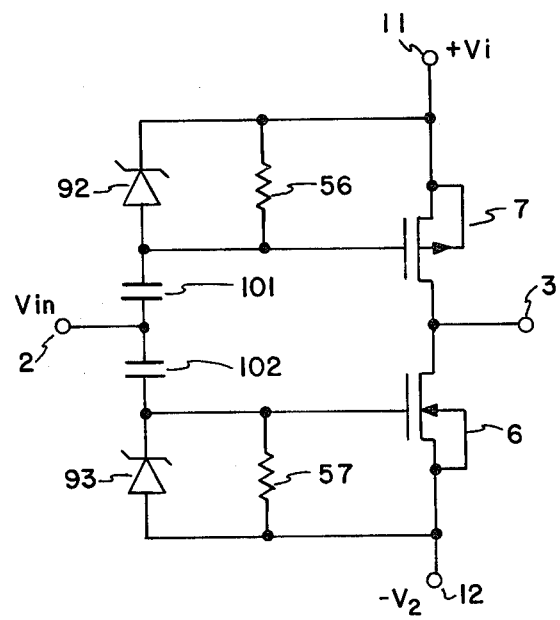
FIG. 9 is a circuit diagram showing another embodiment of the high voltage CMOS inverter according to the present invention.
Figure 10A:
FIGS. 10A and 10B show voltage waveforms illustrating the operations of the inverter circuit shown in FIG. 9.
Figure 10B:
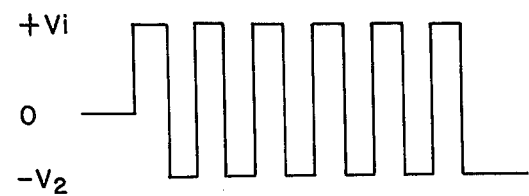

In still another modification, as shown in FIG. 9, the gate inputs to the load transistor 7 and the driver transistor 6 are supplied through capacitors 101 and 102, respectively. Moreover, a resistor 56 and a Zener diode 92 are connected in parallel between the gate and source of a P-channel transistor 7 whereas a resistor 57 and a Zener diode 93 are connected in parallel between the gate and source of an N-channel transistor 6. A positive supply voltage $+V_1$ is applied to a power supply terminal 11 connected to the source electrode of the P-channel transistor 7. A negative supply voltage $-V_2$ is applied to the power supply terminal 12 connected to the source electrode of the N-channel transistor 6. In such a circuit, if input pulse signals, as shown in FIG. 10A, are applied to the input terminal 2, the high voltage pulse train of $|V_1+V_2|$ peak to peak ranging from $+V_1$ to $-V_2$, as shown in FIG. 10B, can be generated at the output terminal 3. Here, the values of $V_1$ and $V_2$ are selected to satisfy the relationship of $|V_1|+|V_2|=|V_0|$. Needless to say, the maximum value of $V_0$ is determined by the breakdown voltage of the transistors 6 and 7.

Figure 11:
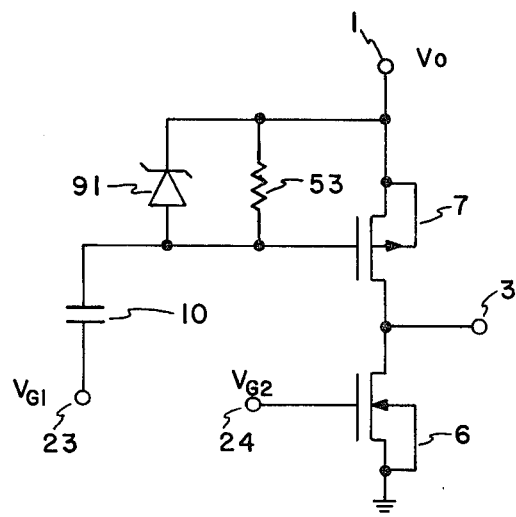
FIG. 11 is a circuit diagram showing still another embodiment of the high voltage CMOS inverter according to the present invention.

In a further modification, as shown in FIG. 11, independent gate input signals are applied to terminal 24 for the driver transistor 6 and to signal terminal 23 for the load transistor 7. If a capacitive load is connected to the output of the CMOS inverter circuit, the power consumption is ideally equal to the power required to charge and discharge the capacitive load. However, if there is a moment when both transistors 6 and 7 are turned on as they switch between their on-off states, current flows between the power supply $V_0$ and ground and that current results in a reactive power loss. For instance, in an application using the MOS inverter for a large load, the transistors 6 and 7 and the capacitor 10 must be enlarged. However, the reactive power often increases owing to a distortion of the gate input signal pulses due to a lack of driving capability for gate driving circuits.

Figure 12A:
FIGS. 12A to 12C show voltage waveforms illustrating the operations of the inverter circuit shown in FIG. 11.
Figure 12B:
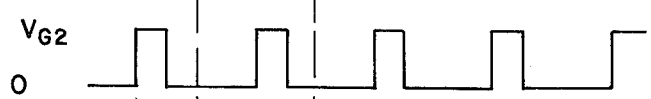

Since such a reactive power cannot be ignored when the power supply voltage is high, a necessary concern is to reduce it. For that purpose, the input terminal 23, at the load side, is supplied with the signal pulse voltage $V_{G1}$, as shown in FIG. 12A. Whereas, the input terminal 24 at the driver side is supplied with the signal pulse voltage $V_{G2}$, as shown in FIG. 12B. With these input signals, the driver transistor 6 is turned on and off, after the load transistor 7 is turned off and on, respectively. Therefore, even if the gate input pulses are distorted, there is no moment when both transistors 6 and 7 are turned on simultaneously. Thus, the reactive power is not produced.

Figure 12C:
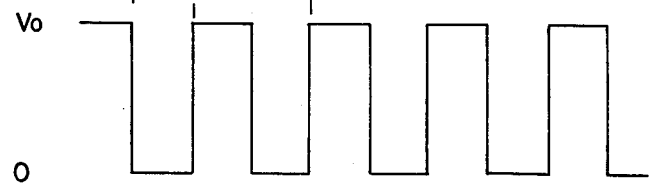

As shown in FIG. 12C, the output pulses are obtained from the output terminal 3 with a peak value $V_o$. In this embodiment, the input signals $V_{G1}$ and $V_{G2}$ may have different amplitudes to compensate for the threshold difference of the transistors 6 and 7 or for the capacitance ratio of the coupling capacitor 10 and MOS gate capacitance of the load transistor 7. Moreover, it is not necessary to keep the low level of the input signal $V_{G1}$ at ground. Although the embodiment shown in FIG. 11 is a modification of the embodiment of FIG. 3, it is a matter of fact that similar modifications can also be made for the circuits shown in FIG. 8 and FIG. 9.

In the foregoing description, a positive high voltage is applied to the power supply terminal 1 of the load transistor 7 so that a positive high voltage output is generated. It is, however, clear that the polarities of the transistors and diodes of the aforementioned circuits can be reversed so that a negative high voltage output can be generated by the application of a negative high voltage. In an MOS transistor, an N-channel MOS transistor ordinary has a lower on-resistance than a P-channel MOS transistor has, with the same gate width. For this reason, the N-channel MOS transistor enjoys a benefit if the value of the coupling capacitor 10 is reduced by using it as a load transistor having narrow gate electrode and small MOS gate capacitance.

Furthermore, so long as a coupling capacitor is connected between an input signal terminal and a gate electrode of the transistor, there is no need to set the low level of the input signal applied to an input terminal at ground.

As has been described hereinbefore, the high voltage inverter circuits according to the present invention have complementary MOS structure, and their high voltage load transistor can be turned on and off at a high speed by low voltage gate input signal via "gate coupling capacitors." Therefore, compared with conventional ones, the present high voltage inverter circuits have the advantage of (1) low-input voltage operation and (2) low driving power dissipation owing to gate coupling capacitors, and (3) large output current capacity due to CMOS structure, which enables high frequency operation. Thus, they can be used as high voltage, high frequency pulse generators for driving the AC-type plasma display device, that is one of the intended objects of the invention. Since little power is required for the gate-drive, a lower power consumption (as compared to that of the prior art method) can be realized.

What is claimed is:

1. An inverter circuit comprising a complementary pair formed by first and second insulated gate field effect transistors connected in series across terminals of a power supply, an output terminal coupled to a junction point between said first and second transistors, a diode coupled between a control electrode of said first transistor and a power supply terminal associated therewith, said diode being poled to clamp said control electrode at a predetermined voltage relative to the voltage of the power supply terminal associated with said first transistor, an input terminal coupled to a control electrode of said second transistor, means including a capacitance means coupled between said control electrode of said first transistor and said input terminal for establishing a time constant at said control electrode of said first transistor, and means for applying to said input terminal an input control pulse which is shorter than said time constant, the capacitance value of said capacitance means being sufficiently larger than the internal capacitance of said first transistor so that a potential difference substantially equal to the amplitude of said input control pulse appears between said power supply terminal associated with said first transistor and the control electrode of said first transistor and the voltage at the control electrode of said first transistor becomes lower than the voltage of said power supply terminal associated with said first transistor to the extent that said first transistor may be turned on when said input control pulse goes from a high level to a low level.

2. The inverter of claim 1 wherein said established time constant is the RC time constant of said capacitance means coupled in series with a resistance means which is in turn coupled in parallel with said diode.

3. The inverter of claim 1 or claim 2 wherein said diode is a Zener diode.

4. The inverter of claim 3 further comprising a second Zener diode coupled to said control terminal of said second transistor.

5. The inverter of claim 1, further comprising a second diode coupled between the control electrode of said second transistor and the power supply terminal associated therewith, and means including a second capacitance means coupled between the control electrode of said second transistor and said input terminal for establishing a second time constant at the control electrode of said second transistor, said second capacitance means being sufficiently larger than the internal capacitance of said second transistor.

6. The inverter of claim 5 wherein said second time constant is the RC time constant of said second capacitance means and a second resistance means coupled between said second capacitance means and a power supply terminal associated with said second transistor.

7. The inverter of claim 5 further comprising a resistance means coupled between said control terminal of said second transistor and said power supply terminal associated with said second transistor.

8. The inverter of claim 1 or claim 5, further comprising means for independently applying input pulses to control electrodes of said first and second transistors, said input pulses having pulse periods which preclude a simultaneous switching one of the two transistors.

9. A plasma display panel comprising an X-Y matrix of dots arranged in columns and rows; column driver means for selectively energizing any predetermined ones of said columns; line driver means for selectively energizing any one of said rows, whereby the combination of the selective energization of said column and line driver means selects predetermined dots in said matrix; and inverter means individually associated with said column driver means and said line driver means, respectively, for energizing said driver means; each of said inverter means comprising a complementary pair formed by first and second insulated gate field effect transistors connected in series across terminals of a power supply; an output terminal coupled to a junction point between said first and second transistors; a diode coupled between a control electrode of said first transistor and a power supply terminal associated therewith, said diode being poled to clamp said control electrode at a predetermined voltage relative to the voltage of the power supply terminal associated with said first transistor; an input terminal coupled to a control electrode of said second transistor; means including a capacitance means coupled between said control electrode of said first transistor and said input terminal for establishing a time constant at said control electrode of said one transistor; and means for applying to said input terminal an input control pulse which is shorter than said time constant, the capacitance value of said capacitance means being sufficiently larger than the internal capacitance of said first transistor so that a potential difference substantially equal to the amplitude of said input control pulse appears between said power supply terminal associated with said first transistor and the control electrode of said first transistor and the voltage at the control electrode of said first transistor becomes lower than the voltage of said power supply terminal associated with said first transistor to the extent that said first transistor may be turned on when said input control pulse goes from a high level to a low level.

10. A plasma display panel comprising an X-Y matrix of data means arranged in rows and columns; column driver means for selectively energizing any preselected ones of said columns in said matrix; line driver means for selectively energizing any preselected one of said rows in said matrix; inverter means individually associated with each of said driver means for generating high voltage pulses for driving said driver means and thereby driving the rows and columns of said matrix, each of said inverter means comprising a pair of N- and P-type insulated gate field effect transistors coupled in series; an output terminal connected between drain electrodes of said transistors, for generating said high voltage pulses; a diode coupled between the source and gate electrodes of one of said transistors; a resistance means coupled to the gate of said one transistor, the other side of said resistance means being connected to either the source of said one transistor or to ground voltage; a capacitance means connected to the gate of said one transistor, means for applying to the other side of said capacitance means a low voltage pulse having a period which is shorter than the RC time constant of said capacitance means and said resistance means; means for applying a high voltage to the source of said one transistor; and means for applying to the gate of the other transistor a low voltage input signal; said capacitance means being sufficiently larger than the gate input capacitance of said one transistor so that a potential difference substantially equal to the amplitude of said low voltage pulse applied to said capacitance means appears between said source and gate of said one transistor whereby the voltage on the gate of said one transistor decreases to a level which is sufficiently lower than the voltage on the source of said one transistor to turn on said one transistor when said low voltage pulse applied to said capacitance means goes from a high level to a low level.

11. The inverter of claim 10 wherein said diode is a Zener diode poled to clamp said control electrode at a predetermined voltage relative to the voltage of the power supply terminal associated with said one transistor.

12. The inverter of claim 11 further comprising a second Zener diode coupled to the gate of said other transistor to protect an oxide film associated therewith.

13. A high voltage complementary insulated gate field effect transistor inverter circuit comprising, a first terminal connected to a high voltage power supply, a second terminal connected to a low voltage power supply, an output terminal for delivering either said high or low voltages, an input terminal, a P-channel insulated gate field effect transistor coupled across said first and output terminals, an N-channel insulated gate field effect transistor coupled across said second and output terminals, the gate electrode of said N-channel insulated gate field effect transistor being connected to said input terminal, a diode coupled across said first terminal and the gate electrode of said P-channel insulated gate field effect transistor, a resistor coupled across said first terminal and said gate electrode of said P-channel insulated gate field effect transistor, a capacitor coupled between said gate electrode of said P-channel insulated gate field effect transistor and the gate electrode of said N-channel insulated gate field effect transistor, and means for applying to said input terminal a low voltage pulse having a period which is shorter than the RC time constant of said capacitor and said resistor, the negative side of said diode being connected to said first terminal so that the voltage on the gate electrode of said P-channel insulated gate field effect transistor is kept below the voltage on said first terminal when said low voltage pulse goes from a low level to a high level, the capacitance of said capacitor being sufficiently larger than the gate input capacitance of said P-channel insulated gate field effect transistor so that a potential at the gate electrode of said P-channel insulated gate field effect transistor becomes lower than the potential at said first terminal to the extent that said P-channel insulated gate field effect transistor is turned on when said low voltage pulse goes from said high level to said low level.

14. An inverter circuit comprising a pair of N-and-P type insulated gate field effect transistors coupled in series, an output terminal connected between drain electrodes of said transistors, a diode coupled between the source and gate electrodes of one of said transistors, an input terminal connected to the gate electrode of the other transistor, means including a capacitance means connected to the gate electrode of said one transistor for establishing a time constant, means for applying to the other side of said capacitance means a low voltage pulse having a period which is shorter than said time constant, said low voltage pulse being applied through either said input terminal or another individual input terminal connected to said capacitor, said diode being poled to clamp the gate electrode of said one transistor at a predetermined voltage relative to the voltage of a power supply terminal associated with said one transistor when said low voltage pulse goes from a low level to a high level, the capacitance of said capacitance means being sufficiently larger than the gate input capacitance of said one transistor so that most of said low voltage pulse appears between the gate and the source of said one transistor due to the capacitive division of said capacitance means and said gate input capacitance which are connected in series with each other between said power supply terminal and either said input terminal or said another individual input terminal, whereby the voltage on the gate of said one transistor is lower than the voltage at the source of said one transistor so as to turn on said one transistor when said low voltage pulse goes from said high level to said low level.

15. An inverter circuit comprising a pair of N-and-P type insulated gate field effect transistors coupled in series, an output terminal connected between drain electrodes of said transistors, a diode coupled between the source and gate electrodes of one of said transistors, said diode being poled to clamp said gate electrode at a predetermined voltage relative to the voltage of a power supply terminal associated with said one transistor, an input terminal connected to the gate electrode of the other transistor, a resistor coupled to the gate of said one transistor, the other side of said resistor being connected to ground voltage, a capacitor having a capacitance which is larger than the gate input capacitance of said one transistor, said capacitor being connected to the gate electrode of said one transistor, means for applying to the other side of said capacitor a low voltage pulse having a period which is shorter than the RC time constant of said capacitor and said resistor, through either said input terminal or another individual input terminal connected to said capacitor.

16. The inverter circuit of either claim 14 or claim 15 and means for applying said low voltage pulse through said input terminal.

17. The inverter circuit of either claim 14 or claim 15 and another input terminal connected to said capacitor, and means for applying said low voltage pulse through said other input terminal.

18. An inverter circuit comprising a complementary pair of insulated gate field effect transistors connected in series across terminals of a power supply, electronic switch means coupled between a control electrode of one of said pair of transistors and a power supply terminal associated therewith, means including a capacitance means connected at its one terminal to said control electrode of said one transistor for establishing a time constant at said control electrode of said one transistor, said capacitance means being larger than the internal capacitance of said one transistor, means for applying to the other terminal of said capacitance means a control pulse which is shorter than said time constant, and means for applying to the control electrode of said other transistor an input control pulse, the relationship between said control pulse and input control pulse being such that said one transistor is turned on to its conducting state while said other transistor is in its nonconducting state.

* * * * *